(12) United States Patent
McCord et al.

(10) Patent No.: US 7,714,300 B1
(45) Date of Patent: May 11, 2010

(54) HIGH-SPEED HIGH-EFFICIENCY SOLID-STATE ELECTRON DETECTOR

(75) Inventors: Mark A. McCord, Los Gatos, CA (US); Tom G. Miller, Portland, OR (US); David L. Brown, Sunnyvale, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 280 days.

(21) Appl. No.: 11/711,552

(22) Filed: Feb. 26, 2007

Related U.S. Application Data

(60) Provisional application No. 60/817,007, filed on Jun. 27, 2006.

(51) Int. Cl.
*G01T 1/00* (2006.01)

(52) U.S. Cl. .................. 250/397; 250/472.1; 250/488.1

(58) Field of Classification Search .................. 250/397, 250/396 R, 398, 400, 339.03, 370.01, 370.02, 250/370.06, 370.12, 370.14; 438/48, 56, 438/57; 257/438, 439, 440, 458, 656, E31.087, 257/E31.088
See application file for complete search history.

(56) References Cited

U.S. PATENT DOCUMENTS

| | | | |
|---|---|---|---|
| 4,785,186 A * | 11/1988 | Street et al. ............ 250/370.14 |
| 5,252,142 A | 10/1993 | Matsuyama et al. |
| 5,594,237 A | 1/1997 | Kulick et al. |
| 6,204,087 B1 * | 3/2001 | Parker et al. ................... 438/56 |
| 6,864,482 B2 | 3/2005 | Sato et al. |
| 7,009,187 B2 | 3/2006 | Gerlach et al. |
| 2003/0155654 A1 * | 8/2003 | Takeuchi et al. ............ 257/760 |
| 2004/0211896 A1 * | 10/2004 | Laprade et al. ............. 250/288 |
| 2005/0224707 A1 * | 10/2005 | Guedj et al. ................. 250/239 |
| 2007/0048746 A1 * | 3/2007 | Su et al. ......................... 435/6 |
| 2007/0072332 A1 * | 3/2007 | Kemmer ...................... 438/56 |
| 2007/0075251 A1 * | 4/2007 | Doughty et al. ........ 250/370.01 |
| 2007/0077725 A1 * | 4/2007 | Wilson et al. ............... 438/427 |
| 2007/0262404 A1 * | 11/2007 | Meyer et al. ................. 257/429 |

OTHER PUBLICATIONS

M. Gokkavas, et al "High-Speed High-Efficiency Large-Area Resonant Cavity Enhanced p-i-n. Photodiodes for Multimode Fiber Communications" Dec. 2001, pp. 1349-1351, vol. 13, No. 12, IEEE Photonics Technology Letters.

* cited by examiner

*Primary Examiner*—Jack I Berman
*Assistant Examiner*—Nicole Ippolito Rausch
(74) *Attorney, Agent, or Firm*—Okamoto & Benedicto LLP

(57) ABSTRACT

One embodiment relates to a solid-state charged-particle detector. The detector includes a PIN diode and a conductive coating on the front-side of the PIN diode, wherein the front-side receives incident charged particles to be detected. In addition, the detector includes a metal layer on the backside of the PIN diode and electrical connections to the metal layer and to the conductive coating. Other embodiment are also disclosed.

11 Claims, 5 Drawing Sheets

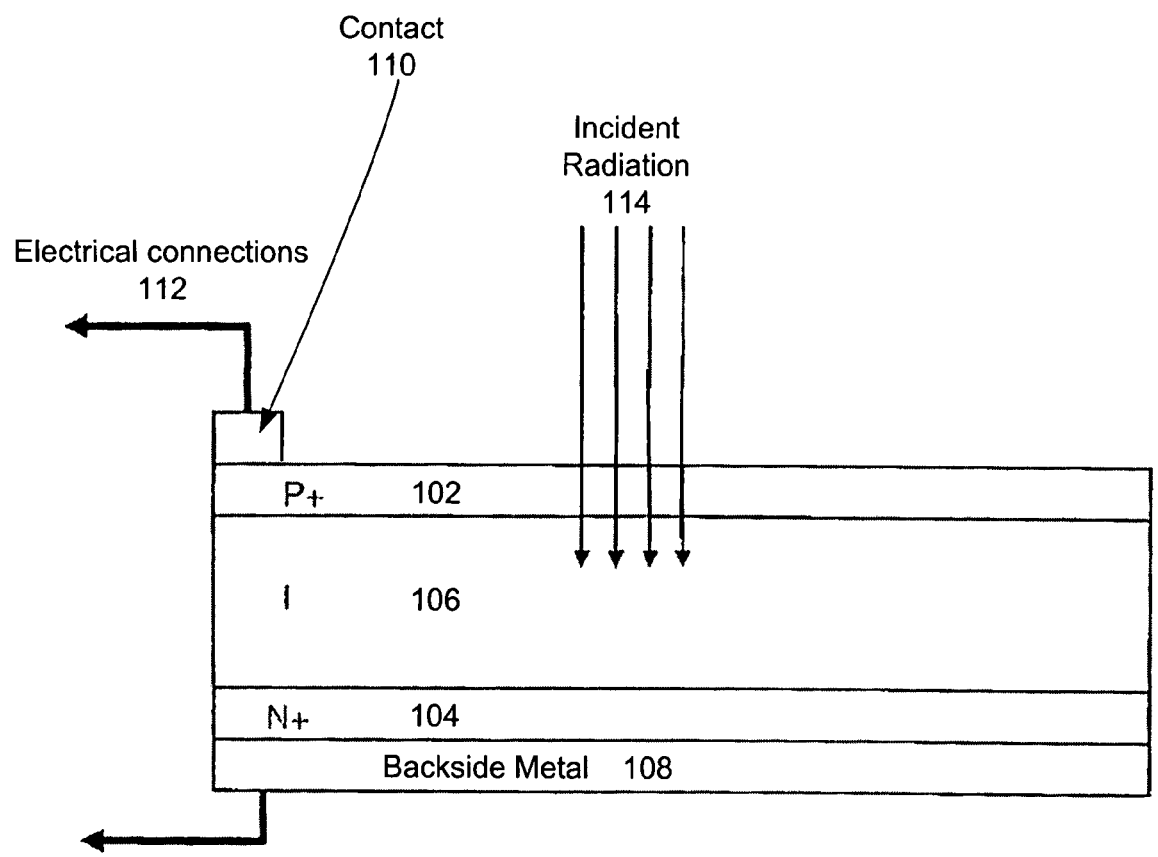
FIG. 1
(Conventional)

(Planar view)

HIGH-SPEED HIGH-EFFICIENCY SOLID-STATE ELECTRON DETECTOR

CROSS-REFERENCE TO RELATED APPLICATION

The present application claims the benefit of U.S. Provisional Patent Application No. 60/817,007, entitled "High-Speed High-Efficiency Solid-State Electron Detector", filed Jun. 27, 2006, by inventors Mark A. McCord, Tom G. Miller, and David L. Brown, the disclosure of which is hereby incorporated by reference.

BACKGROUND OF THE INVENTION

1. Field of the Invention

The present disclosure relates to electron beam detection.

2. Description of the Background Art

One type of electron beam apparatus is a scanning electron microscope (SEM). SEMs obtain an image of a sample by scanning a primary electron beam over the sample and detecting secondary electrons emitted from the sample. The image may be used, for example, for inspection or measurement of a micropattern in a semiconductor device, or for other purposes.

SEMs typically employ scintillator-type detectors for detecting secondary electrons emitted from the object being observed. When electrons impact material within the scintillator-type detector, the material emits light. The light is detected by a photon detector, such as a photomultiplier tube, which converts the light into an electric signal.

It is highly desirable to improve electron detectors for scanning electron microscopes and other apparatus.

SUMMARY

One embodiment relates to a solid-state charged-particle detector. The detector includes a PIN diode and a conductive coating on the front-side of the PIN diode, wherein the front-side receives incident charged particles to be detected. In addition, the detector includes a metal layer on the backside of the PIN diode and electrical connections to the metal layer and to the conductive coating.

Another embodiment relates to a method of detecting electrons using a solid state detector. Electrons are received by a continuous conductive coating, and transmitted through the conductive coating to a PIN diode. Electron-hole pairs are generated within the diode, and an electrical current is formed through electrical connections to the conductive coating and to a backside metal layer.

Another embodiment pertains to a solid-state electron detector which includes at least the following: a PIN diode; a metal layer on the backside of the PIN diode; an oxide coating on the front-side of the PIN diode; a continuous conductive coating over the oxide coating; and electrical connections to the metal layer and to the conductive coating.

Another embodiment pertains to a solid-state electron detector which includes at least the following: a PIN diode; a metal layer on the backside of the PIN diode; an oxide coating on the front-side of the PIN diode; a continuous conductive coating over the oxide coating; conductive vias through the oxide coating; and electrical connections to the metal layer and to the conductive coating.

Other embodiments and features are also disclosed.

BRIEF DESCRIPTION OF THE DRAWINGS

FIG. 1 is a cross-sectional diagram depicting a conventional solid-state photonic detector.

Figure 2:
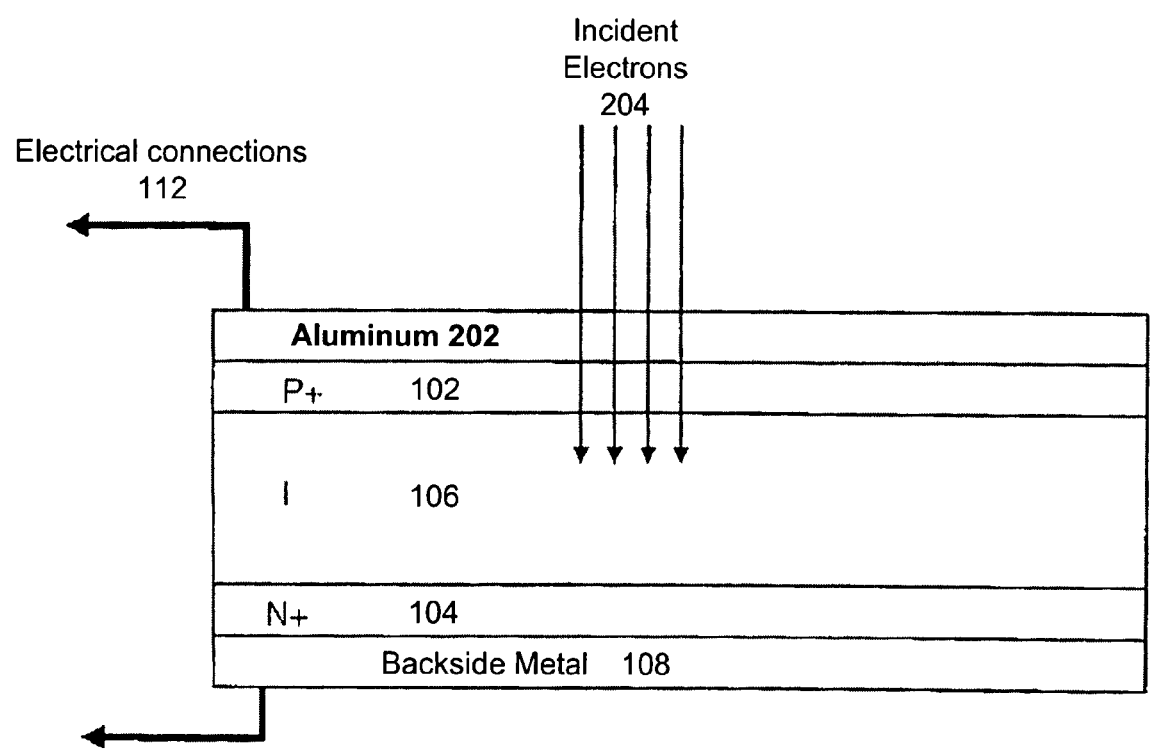
FIG. 2 is a cross-sectional diagram depicting an electron detector in accordance with a first embodiment of the invention.

These drawings are used to facilitate the explanation of embodiments of the present invention. The drawings are not necessarily to scale.

DETAILED DESCRIPTION

Conventional Solid-State Detectors

FIG. 1 is a cross-sectional diagram depicting a conventional solid-state detector 100. The conventional solid-state detector 100 includes a silicon chip including a P+ doped region 102 near the front surface and an N+ doped region 104 near the back surface, and an intrinsic region 106 therebetween to form a PIN (positive-intrinsic-negative) diode. In some cases, the N+ and P+ regions may be reversed. The front surface is typically coated with a thin protective layer of silicon dioxide or silicon nitride (not shown). A backside metal layer 108 and a front-side metal contact 110 are connected to electrically (see electrical connections 112). When incident photon radiation 114 of sufficiently high energy impinges upon the detector, electron-hole pairs are created in the semiconductor. The electron-hole pairs created in a depleted region separate and create an electrical current through the electrical connections 112. Ideally, the electrical current produced is proportional to the incoming photon flux.

Disadvantages of Using Conventional Solid-State Detector to Detect Electrons The speed of a detector relates to its response time, or the time needed to respond to the incoming radiation and produce an external current. In order to increase the speed of the detector, the area of the detector is conventionally decreased. However, as a detector's area becomes smaller, then its efficiency typically suffers. For example, under high intensity irradiation, a large voltage drop can develop across the diode which results in a saturation effect.

In order to maintain high efficiency, a large-area detector is desirable. Unfortunately, the speed of a large-area detector is limited by the combination of diode junction capacitance and resistance through the P+ and N+ collection regions. As such, there is a trade-off between detector speed and efficiency.

High-Speed High-Efficiency Solid-State Electron Detector

FIG. 2 is a cross-sectional diagram depicting an electron detector 200 in accordance with a first embodiment of the invention. In this embodiment, the electron detector 200 comprises a PIN diode which includes a thin conductive coating 202 over the top surface (the surface receiving the incident electrons). The thickness of the coating 202 is preferably uniform over the top surface.

In the specific implementation illustrated, the thin conductive coating comprises an aluminum coating. Other metals or alloys may be used instead of Aluminum. Lighter element metals are preferred, such as Beryllium or Aluminum, since they have smaller cross sections for absorbing or scattering the incident electrons 204. Alternatively, non-metal conductive materials may be used, such as graphite (which also has a small cross section for electrons). Unlike the conventional metal contact, the thin conductive coating 202 is applied over all or most of the top surface of the PIN diode.

As a first consideration, the thin conductive coating 202 is configured to be of a sufficient thickness so as to substantially lower a series resistance of the device. This advantageously results in a higher speed for the detector 200 because the speed is limited by the series resistance and the junction capacitance.

As a second consideration, the think conductive coating 202 is configured to be sufficiently thin so that a large fraction of the incident electrons 204 pass through the coating 202 and into the PIN diode. This advantageously maintains a high efficiency for the detector 200.

The above two considerations determine the desirable thickness of the coating 202; thick enough to lower the series resistance for displacement current in the coating, while not too thick so as to avoid blocking most of the incident electrons 204 from passing through the coating. As such, the device 200 advantageously combines high-speed and high-efficiency capabilities. The high-speed capability of the device 200 is reflected in its improved frequency response.

Furthermore, a substantial displacement current may flow through the conductive coating 202 to the top electrical connection. This advantageously enables the device 200 to be able to handle a high current density (i.e. a high flux density) of incident electrons.

Such a conductive coating 202 cannot be applied effectively to PIN detectors used to detect photons. This is because the conductive coating 202 would typically absorb photons.

In an alternate approach, instead of the thin conductive coating 202 covering most or all of the top surface, a conductive grid may be used for an electron detector. Such a conductive grid is used, for example, in solar cells which generate electrical current from sunlight. The conductive grid spans the top surface but has openings to large areas of the top surface.

White such a conductive grid may be used, applicants believe such a device has disadvantages when the device is used as an electron detector. One disadvantage is that there is a variation in speed relative to the position at which an incident electron beam impinges upon the detector. In other words, the speed depends on how close the electrons land to the grid lines. In addition, there is a variation in collection efficiency across the device that can result in image artifacts when used for some applications. For example, a shadow image of the metal grid may appear in some scanning electron microscope applications. Furthermore, if the conductive grid is of a material and/or thickness so as to scatter or absorb a large fraction of the incident electrons impinging upon the grid material, then there is a loss of efficiency or quantum yield due to the scattered or absorbed electrons.

Figure 3:
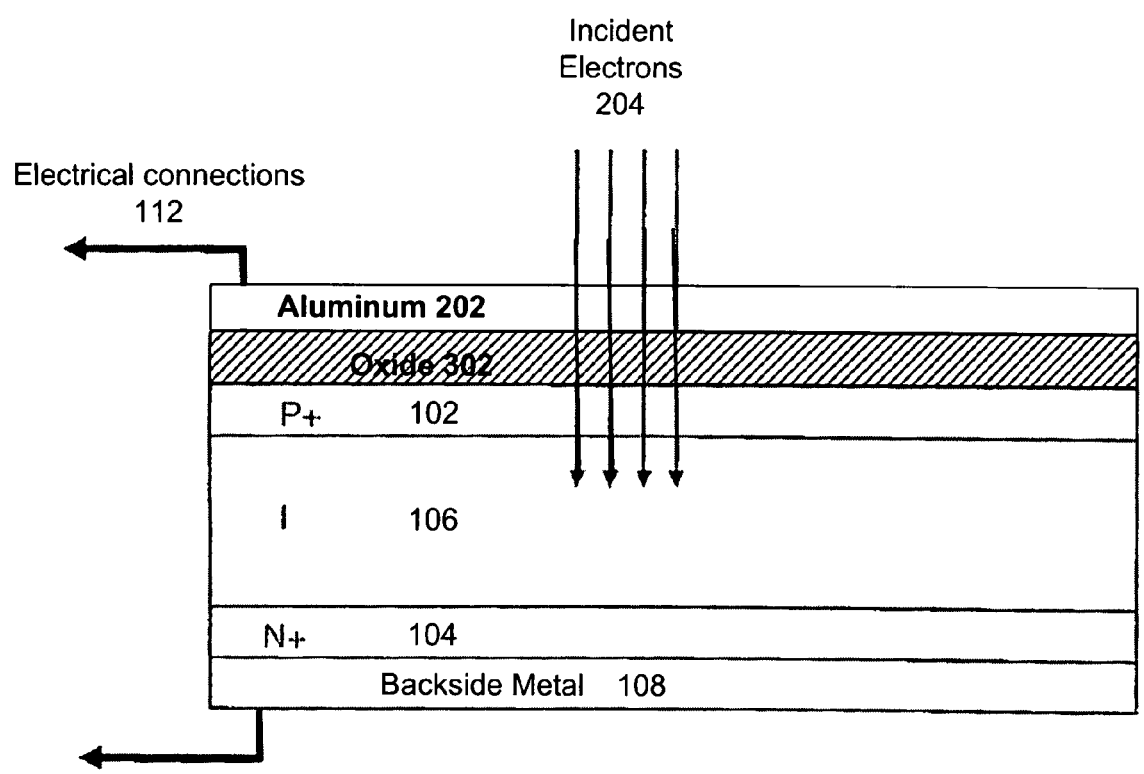
FIG. 3 is a cross-sectional diagram depicting an electron detector in accordance with a second embodiment of the invention.

FIG. 3 is a cross-sectional diagram depicting an electron detector 300 in accordance with a second embodiment of the invention. In this embodiment, the electron detector comprises a PIN detector which includes a thin oxide coating 302 and a thin conductive coating 202 over the top surface.

In this embodiment, the inclusion of the oxide coating 302 between the top surface of the PIN diode and the conductive coating 202 creates a capacitative layer in series with the junction capacitance of the diode. At high frequencies, this series capacitance decreases the RC time delay of the device 300, and so enables higher-speed operation of the electron detector.

Figure 4:
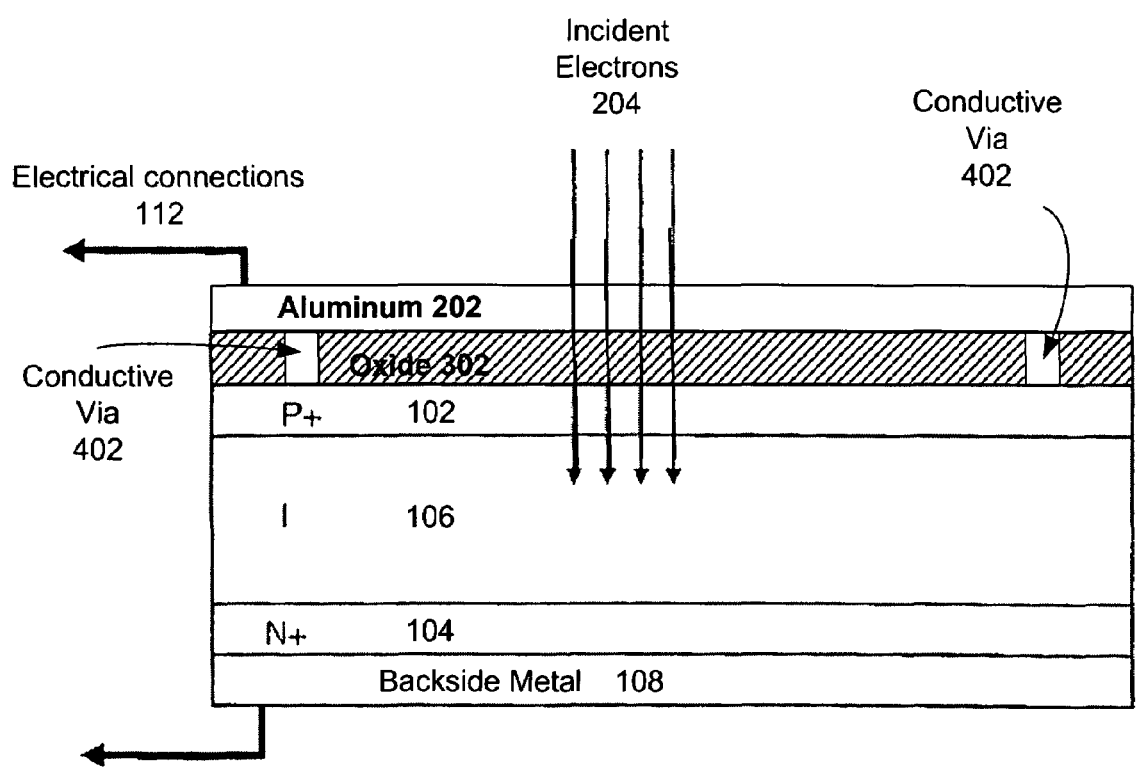
FIG. 4 is a cross-sectional diagram depicting an electron detector in accordance with a third embodiment of the invention.

FIG. 4 is a cross-sectional diagram depicting an electron detector in accordance with a third embodiment of the invention. Similar to the second embodiment in FIG. 3, the embodiment in FIG. 4 comprises a PIN detector with a thin oxide coating 302 and a thin conductive coating 202 over the top surface. In addition, this embodiment includes conductive vias 402 through the oxide coating 302.

In this embodiment, the conductive vias 402 provide a path for electrical current to flow directly from the top surface of the diode to the conductive coating 202. Together, the conductive vias 402 and the conductive coating 202 lower the series resistance of the device 400. The lower series resistance further enables high-speed operation.

Figure 5:
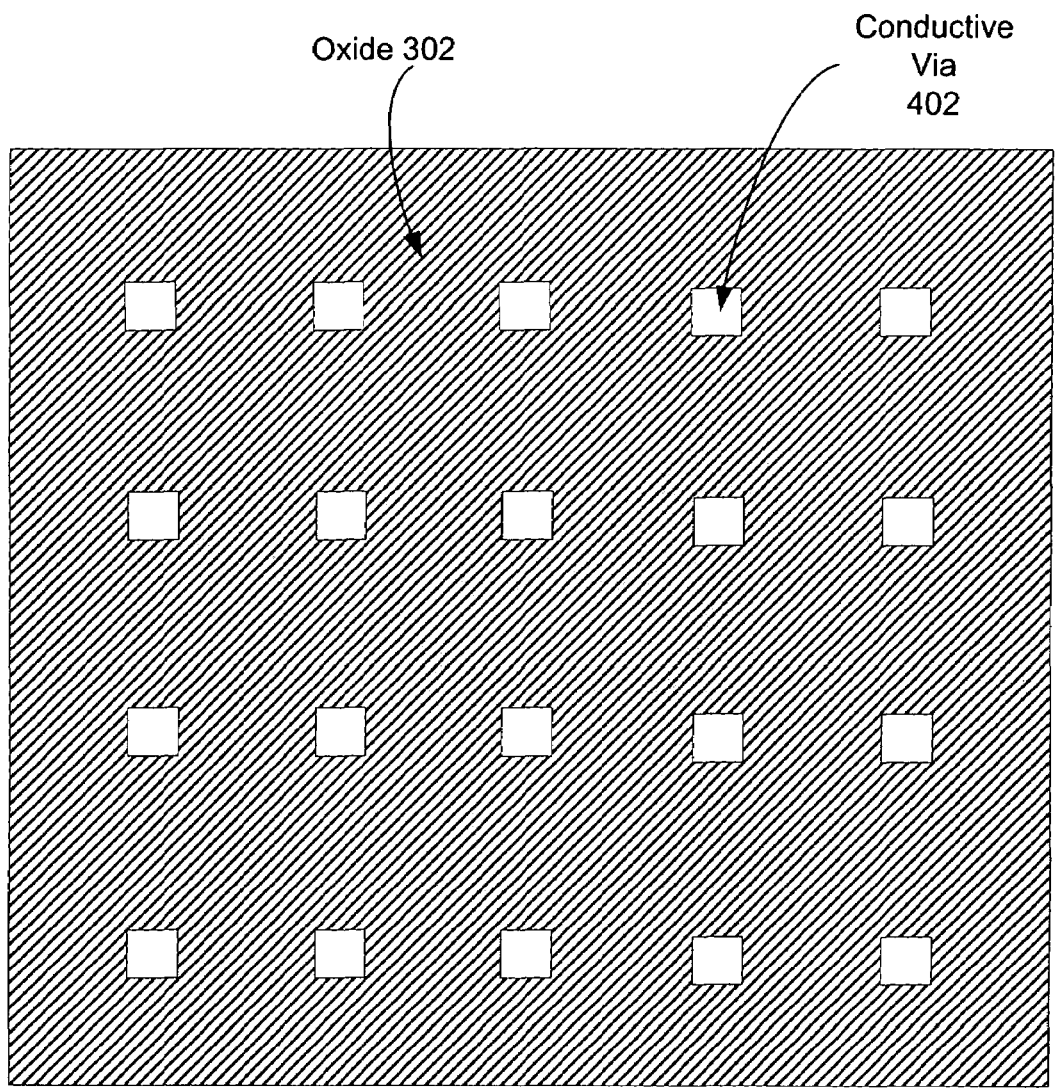
FIG. 5 is a planar diagram depicting a layer including conductive vias through the thin oxide coating, as an example layout in accordance with the third embodiment of the invention.

FIG. 5 is a planar diagram depicting an example layout of a layer in the third embodiment of the invention. The depicted layer is the layer which includes conductive vias 402 through the thin oxide coating 302. The layout shown in FIG. 5 is just one example layout with the conductive vias 402 distributed over the area of the detector 400. Various other layouts of the conductive vias 402 may also be utilized in other implementations.

The embodiments of the high-speed high-efficiency solid-state detector described above may be preferably configured with a detector size range (for example, diameter range) of about 5 millimeters (mm) or larger. For example, the detector diameter may be 5 mm, or 8 mm, or 40 mm, or larger.

The embodiments of the high-speed high-efficiency solid-state detector described above may also be preferably configured to operate in a frequency range from 50 megahertz (MHz) to 1 gigahertz (1 GHz). This high frequency range is enabled as discussed above.

While the above discussion relates to an incident beam which comprises electrons, the embodiments of the high-speed high-efficiency solid-state detector described above may also be applied to detect other charged particles, besides electrons.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A solid-state charged-particle detector, the detector comprising:
   a PIN diode;
   a metal layer on the backside of the PIN diode;
   a conductive coating which is uniform and continuous over the front-side of the PIN diode, wherein the front-side receives incident charged particles to be detected;
   electrical connections to the metal layer and to the conductive coating;

an oxide coating between the conductive coating and the PIN diode; and conductive vias through the oxide coating.

2. The detector of claim 1, wherein the conductive coating has high transparency to the incident charged particles.

3. The detector of claim 1, wherein the charged particles comprise electrons.

4. The detector of claim 3, wherein the conductive coating comprises aluminum.

5. The detector of claim 3, wherein the conductive coating comprises beryllium.

6. The detector of claim 3, wherein the conductive coating comprises graphite.

7. The detector of claim 1, wherein the detector is configured with a diameter of at least 5 millimeters and capability to operate at a high frequency of at least 50 megahertz.

8. A method of detecting electrons using a solid state detector, the method comprising:

receiving electrons by a uniform and continuous conductive coating over a front surface of a PIN diode, wherein the conductive coating has high transparency to the electrons;

transmitting the electrons through the conductive coating to the PIN diode;

generating electron-hole pairs within the PIN diode;

forming an electrical current through electrical connections to the conductive coating and to a backside metal layer;

transmitting the electrons through an oxide coating in between the conductive coating and the PIN diode; and conducting electrical current through the oxide coating by way of conductive vias.

9. The method of claim 8, wherein the PIN diode is configured with a diameter of at least 5 millimeters, and the method operates at a high frequency of at least 50 megahertz.

10. A solid-state electron detector, the detector comprising:

a PIN diode;

a metal layer on the backside of the PIN diode;

an oxide coating on the front-side of the PIN diode;

a uniform and continuous conductive coating of graphite over the oxide coating; and electrical connections to the metal layer and to the conductive coating.

11. A solid-state electron detector, the detector comprising:

a PIN diode;

a metal layer on the backside of the PIN diode;

an oxide coating on the front-side of the PIN diode;

a uniform and continuous conductive coating over the oxide coating;

conductive vias through the oxide coating; and electrical connections to the metal layer and to the conductive coating.

* * * * *